United States Patent [19]
Mori

[11] Patent Number: 6,163,070
[45] Date of Patent: Dec. 19, 2000

[54] SEMICONDUCTOR PACKAGE UTILIZING A FLEXIBLE WIRING SUBSTRATE

[75] Inventor: Ryuichiro Mori, Tokyo, Japan

[73] Assignee: Mitsubishi Denki Kabushiki Kaisha, Tokyo, Japan

[21] Appl. No.: 08/977,669

[22] Filed: Nov. 24, 1997

[30] Foreign Application Priority Data

Jun. 2, 1997 [JP] Japan .................................. 9-143724

[51] Int. Cl.[7] .................................................. H01L 23/02
[52] U.S. Cl. ........................ 257/686; 257/696; 257/706; 257/707; 257/738; 257/779; 257/780; 257/784
[58] Field of Search .................................. 257/686, 696, 257/738, 707, 713, 779, 780, 787, 685, 737, 784, 724, 706; 438/110, 122, 109, 612, 613

[56] References Cited

U.S. PATENT DOCUMENTS

| | | | |
|---|---|---|---|
| 5,057,907 | 10/1991 | Ooi et al. ................................. | 257/678 |
| 5,239,447 | 8/1993 | Cotues et al. ............................ | 361/744 |
| 5,343,075 | 8/1994 | Nishino .................................... | 257/686 |
| 5,373,189 | 12/1994 | Massit et al. ............................. | 257/686 |
| 5,559,316 | 9/1996 | Tomada .................................... | 257/666 |
| 5,598,033 | 1/1997 | Behlen et al. ............................ | 257/686 |
| 5,635,760 | 6/1997 | Ishikawa .................................. | 257/692 |
| 5,726,492 | 3/1998 | Suzuki et al. ............................ | 257/685 |
| 5,903,049 | 5/1999 | Mori ......................................... | 257/686 |
| 6,011,694 | 1/2000 | Hirakawa ................................. | 361/774 |

FOREIGN PATENT DOCUMENTS

| | | |
|---|---|---|
| 0 704 897 A2 | 4/1996 | European Pat. Off. . |
| 2 725 305 A1 | 4/1996 | France . |
| 39 31 238 C2 | 3/1991 | Germany . |
| 4-65135 | 3/1992 | Japan . |
| 5-315521 | 11/1993 | Japan . |
| 6-61289 | 3/1994 | Japan . |
| 7-321441 | 12/1995 | Japan . |

OTHER PUBLICATIONS

IBM Technical Disclosure Bulletin, *Improved Method for C–4 Chip join*, vol. 31, No. 6, Nov., 1998, pp. 335 and 336.
IBM Technical Disclosure Bulletin, *Stacked Tab Chip Carrier*, vol. 33, No. 6A, Nov. 1990, pp. 352 and 353.
Productronic 1995, vol. 7, p. 8, No. 459.

*Primary Examiner*—Olik Chaudhuri
*Assistant Examiner*—Alonzo Chambliss
*Attorney, Agent, or Firm*—Oblon, Spivak, McClelland, Maier & Neustadt, P.C.

[57] ABSTRACT

A semiconductor package having a plurality of electrodes arranged along one side of a rectangular semiconductor element; a plurality of wirings, one end of the wiring to be electrically connected with the electrode being arranged adjacent to the electrode and the other end of the wiring being exposed from an opening for external connection; a conductive member provided on the opening for external connection; a flexible wiring substrate on which the semiconductor element is mounted, and the wiring and the conductive member are arranged; and a sealing resin for sealing, except for the conductive member, the semiconductor element and a periphery of the semiconductor element. The semiconductor package can be connected in a horizontal or inclined condition with respect to the substrate for packaging by folding the flexible wiring substrate.

6 Claims, 9 Drawing Sheets

SEMICONDUCTOR PACKAGE UTILIZING A FLEXIBLE WIRING SUBSTRATE

BACKGROUND OF THE INVENTION

1. Field of the Invention

The present invention relates to a semiconductor package, more particularly, to a semiconductor package wherein each length from an electrode of a semiconductor element to a terminal for external connection is made equal to one another and the terminal for external connection is extended only from one side of a package, and a semiconductor module using the semiconductor package.

2. Discussion of Background

FIG. 11 is a perspective view showing an outer appearance of the conventional semiconductor package, for example, of a SVP (surface vertical package) proposed and used in a DRAM operating at a high speed, and FIG. 12 is a plan view showing the inside thereof. In the drawings, numeral 1 denotes a semiconductor package, numeral 2 a lead for external connection, numeral 3 a semiconductor element, numeral 4 an electrode, numeral 5 a wire, and numeral 6 a die pad, respectively. In the present package, the lead 2 for external connection is placed only at one side of the semiconductor package 1. In the inside of the package, electrodes 4 are arranged in approximately one row along one side of the semiconductor element 3. The lead 2 for external connection is electrically connected with the electrode 4 through the wire 5. Electrodes 4 are arranged in approximately one row, and the leads 2 for external connection are arranged only at the side nearest to the electrode 4 of the semiconductor package 1, so that each length of the electrical wiring is short in any electrode 4 and is approximately equal to one another.

A semiconductor package wherein a lead for external connection is arranged only at one side of a semiconductor package is proposed also in Japanese Unexamined Patent Publications No. 61289/1994, No. 21684/1993, No. 321441/1995 or the like. In Japanese Unexamined Patent Publication No. 61289/1994, leads for external connection are arranged at the short side of a semiconductor package, and a vertical packaging operation is conducted with respect to a substrate for packaging so as to reduce the packaging area. In Japanese Unexamined Patent Publication No. 21684/1993, a module is proposed wherein a tape with a lead is extended externally from only one side of a package and is bent into a L-shape so as to package the package to a print substrate. Further, in Japanese Unexmined Patent Publication No. 321441/1995, a semiconductor package is proposed wherein a flexible lead extended from one direction of the semiconductor package is bent into an optional angle, so as to make it possible to package it vertically or obliquely with respect to a wiring substrate with sufficiently securing the contact area with the electrode of the wiring electrode.

In recent years, the reduction of packaging height of the conventional semiconductor package is desired due to requirements for smaller parts size, packaging area and volume with the increase of portable electronic devices. FIG. 13 is a side view showing a case where the conventional semiconductor package 1 shown in FIGS. 11 and 12 is packaged. In the drawing, numeral 7 denotes a substrate for packaging, and H denotes a packaging height. The conventional semiconductor package 1 of an aforementioned configuration is packaged vertically with respect to the substrate 7 for packaging, so that the packaging height H of the package is increased. Also in semiconductor modules proposed in Japanese Unexamined Patent Publications No. 61289/1994 and No. 21684/1993, a semiconductor package is likewise packaged vertically with respect to the substrate for packaging, thereby causing a problem of a large packaging height H. In a semiconductor module disclosed in Japanese Unexamined Patent Publication No. 321441/1995, there is proposed a method for packaging a semiconductor package in an oblique direction with respect to a wiring substrate, but the method causes a problem that the number of parts increases because a holding member for supporting a semiconductor package is required.

When a plurality of semiconductor packages are piled up and packaged for reducing the packaging volume of the semiconductor package, there has been a problem that the heat generation at a high speed operation increases and a temperature increases excessively, thus making the practical use thereof difficult.

The present invention is made to solve the aforementioned problems, and an object of the present invention is, in a semiconductor package and a semiconductor module with a plurality of semiconductor packages mounted thereon, to obtain a semiconductor package and a semiconductor module using it capable of reducing the packaging height with respect to a substrate for packaging, thus making it possible to obtain smaller parts size, and reduced packaging area and volume.

SUMMARY OF THE INVENTION

In accordance with the present invention, there is provided a semiconductor package comprising:

a plurality of electrodes arranged along one side of a rectangular semiconductor element;

a plurality of wirings, one end of the wiring to be electrically connected with the electrode being arranged adjacent to the electrode and the other end of the wiring being exposed from an opening for external connection;

a conductive member provided on the opening for external connection;

a flexible wiring substrate on which the semiconductor element is mounted, and the wiring and the conductive member are arranged; and a sealing resin for sealing, except for the conductive member, the semiconductor element and a periphery of the semiconductor element.

The opening for external connection and the conductive member might be provided on both surfaces of the flexible wiring substrate.

As a conductive member, there might be used solder, other metallic ball, adhesive or the like.

A semiconductor module according to the present invention is made by bringing down and piling up a plurality of semiconductor packages described above to lean one against another, and packaging them obliquely.

In accordance with the present invention, there is further provided a semiconductor module wherein a plurality of semiconductor packages in which openings for external connection and conductor members are provided on both surfaces of a flexible wiring substrate are piled up on a substrate for packaging in a horizontal direction, and the conductive members provided on both surfaces of the flexible wiring substrate in the corresponding same position are connected mutually up and down to conduct a packaging operation.

A radiating means might be interposed between adjacent semiconductor packages of a plurality of semiconductor packages.

DETAILED DESCRIPTION

Embodiment 1

Figure 1:
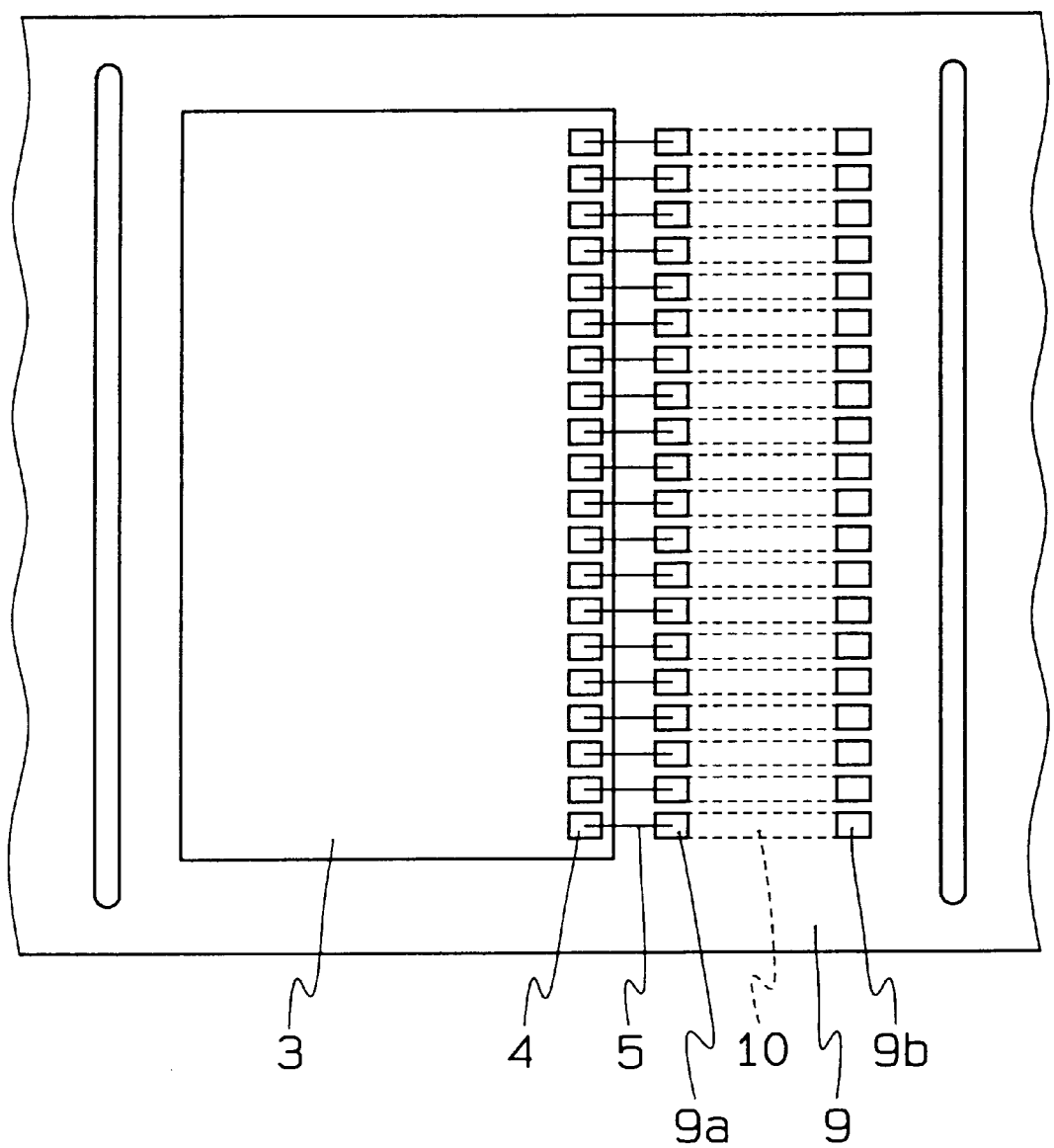
FIG. 1 is a plan view showing the inside of a semiconductor package according to Embodiment 1 of the present invention.
Figure 2A:
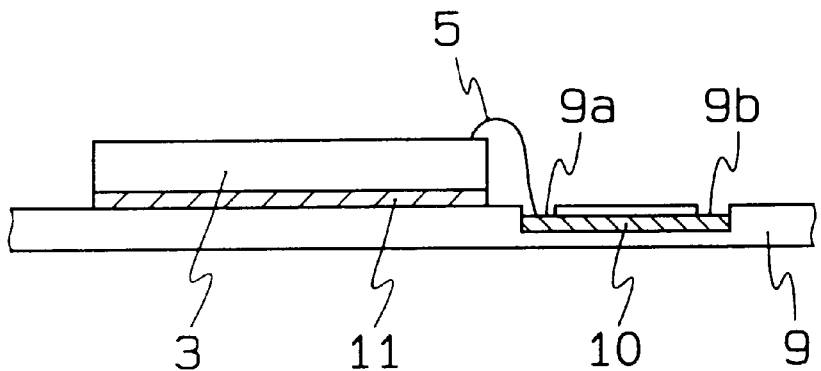
FIGS. 2a and 2b are sectional views showing the inside of a semiconductor package according to Embodiment 1 of the present invention.
Figure 2B:
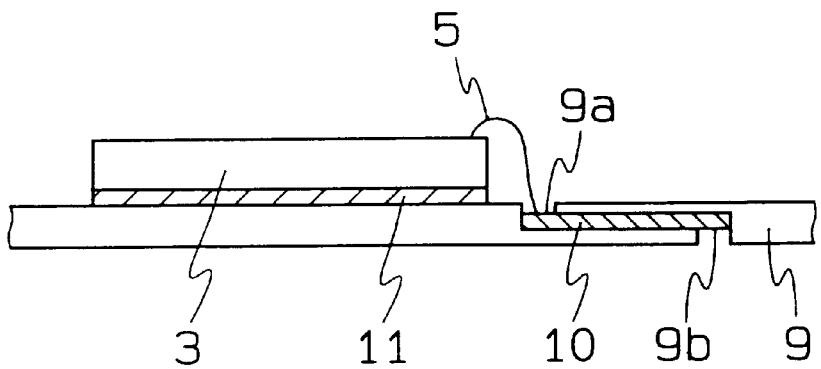
Figure 3:
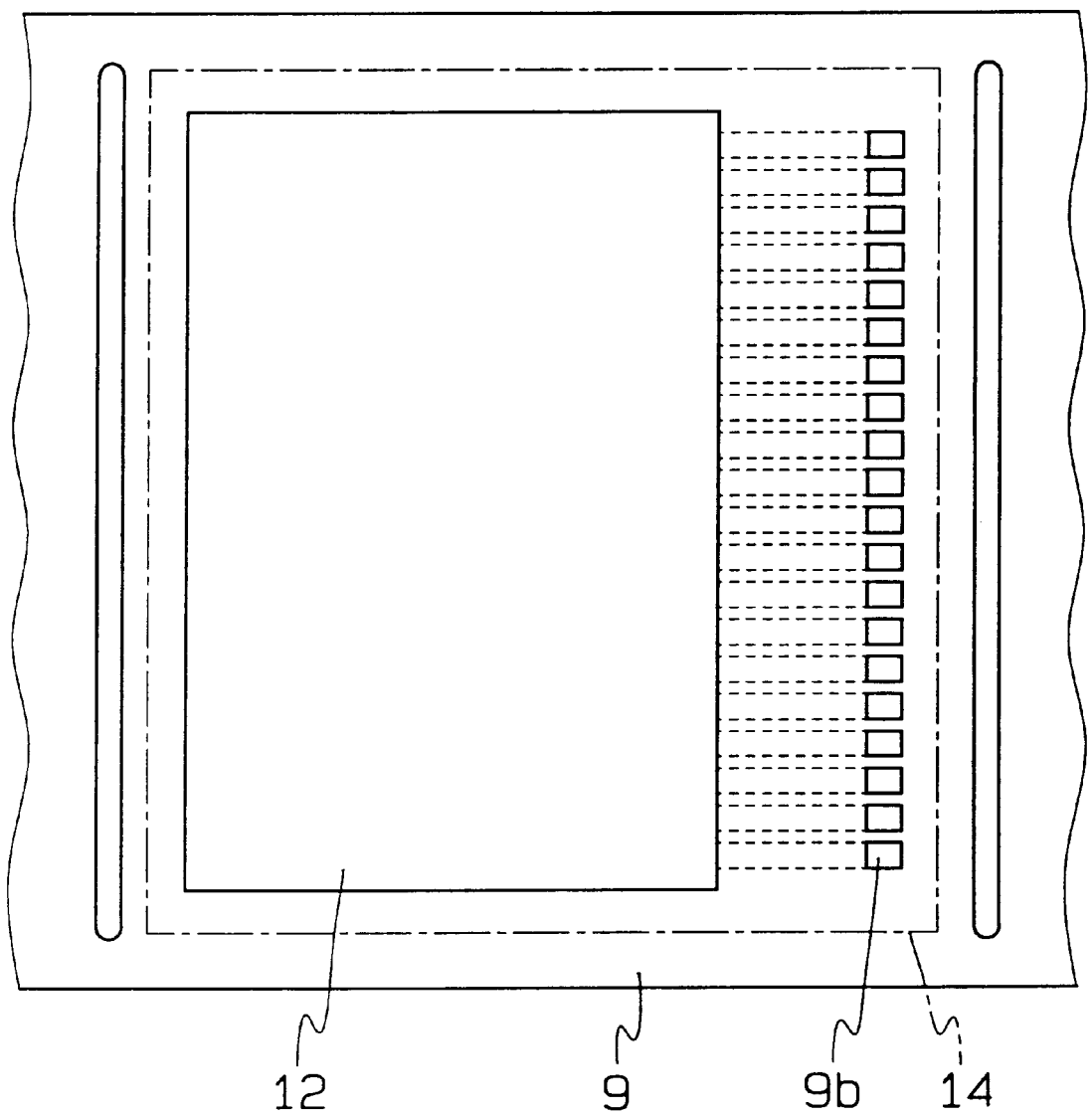
FIG. 3 is a plan view showing a semiconductor package according to Embodiment 1 of the present invention.

FIGS. 1 through 4 are views showing a semiconductor package according to Embodiment 1 of the present invention. FIGS. 1 and 2 are a plan view and a sectional view showing the inside of a semiconductor package, respectively, and FIGS. 3 and 4 are a plan view and a sectional view showing a semiconductor package after being sealed with a sealing resin, respectively. In the drawings, numeral 3 denotes a semiconductor element, numeral 4 an electrode, numeral 5 a wire, numeral 8 a semiconductor package, numeral 9 a flexible wiring substrate, numeral 9a an opening for internal connection, numeral 9b an opening for external connection, numeral 10 a wiring, numeral 11 a die bonding material, numeral 12 a sealing resin, numeral 13 a soldering ball which is a conductive member for external connection, and numeral 14 a cutting line, respectively.

A structure of the semiconductor package 8 according to the present embodiment will be described with reference to the drawings.

The semiconductor element 3 has a plurality of electrodes 4 in one row along its one side (right-hand end in the present embodiment), and is bonded on the flexible wiring substrate 9 capable of folding with the die bonding material 11. The flexible wiring substrate 9 has wirings 10 which are externally extended only from one side of a package. The wirings 10 are exposed from openings 9a for internal connection arranged in approximately one straight line in a position adjacent to the electrodes 4 and from openings 9b for external connection. The electrode 4 and the opening 9a for internal connection are connected with the wire 5. FIG. 2a shows a case where the opening 9a for internal connection and the opening 9b for external connection are both arranged on the top surface of the flexible wiring substrate 9, while FIG. 2b shows a case where the opening 9a for internal connection is arranged on the top surface of the flexible wiring substrate 9, and the opening 9b for external connection on bottom surface of the flexible wiring substrate 9.

Figure 4A:
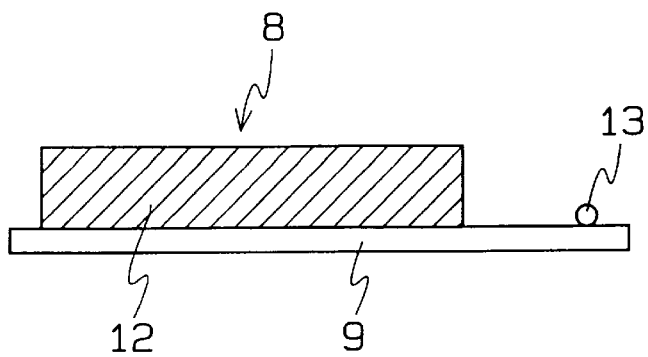
FIGS. 4a and 4b are sectional views showing a semiconductor package according to Embodiment 1 of the present invention.
Figure 4B:
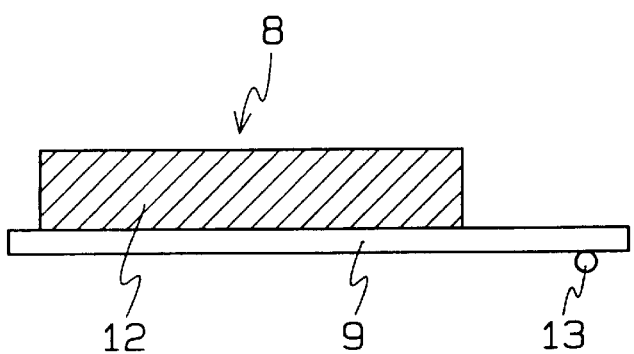
Figure 5A:
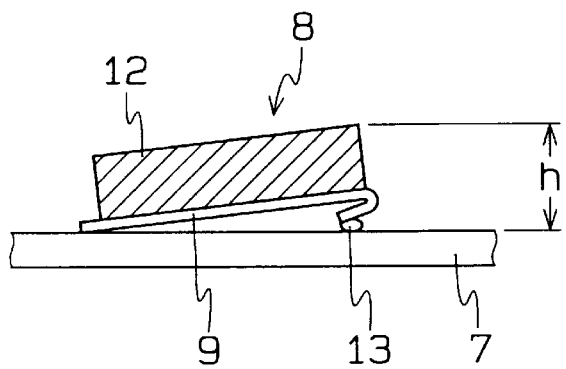
FIGS. 5a and 5b are side views showing a case where a semiconductor package according to Embodiment 1 of the present invention is packaged.
Figure 5B:
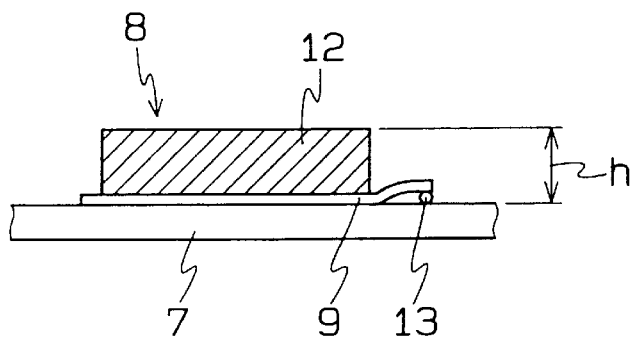

The semiconductor element 3, wire 5, and opening 9a for internal connection as described above are covered with the sealing resin 12 as shown in FIG. 3. Then, as shown in FIGS. 4a and 4b, the soldering ball 13 for external connection is attached to the opening 9b for external connection to conduct a separating operation at a cutting line 14. The semiconductor package 8 manufactured in this manner is connected with the substrate 7 for packaging through the soldering ball 13 as shown in FIGS. 5a and 5b. In FIGS. 5a and 5b, h shows the packaging height of a package. According to the present embodiment, the packaging height h of the package can be made lower than before by folding the flexible wiring substrate 9. Also, as in a semiconductor module shown in FIG. 6, a plurality of semiconductor packages 8 can be brought down and piled up to lean one against another and can be obliquely packaged. Also in this case, the package height h can be made low.

Figure 6:
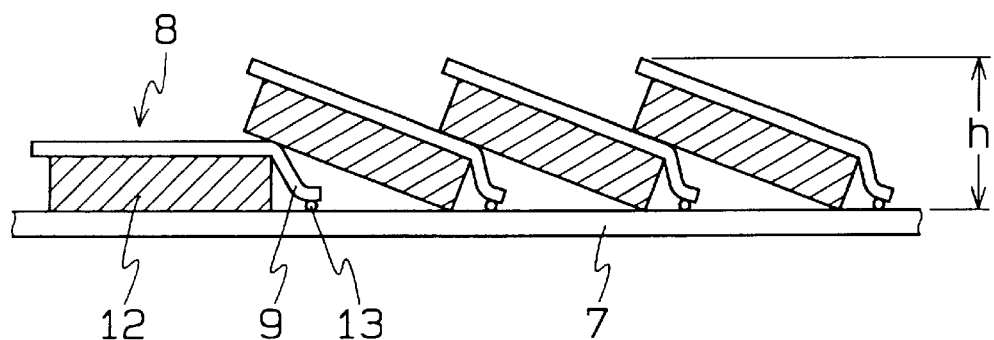
FIG. 6 is a side view showing a semiconductor module according to Embodiment 1 of the present invention.
Figure 7:
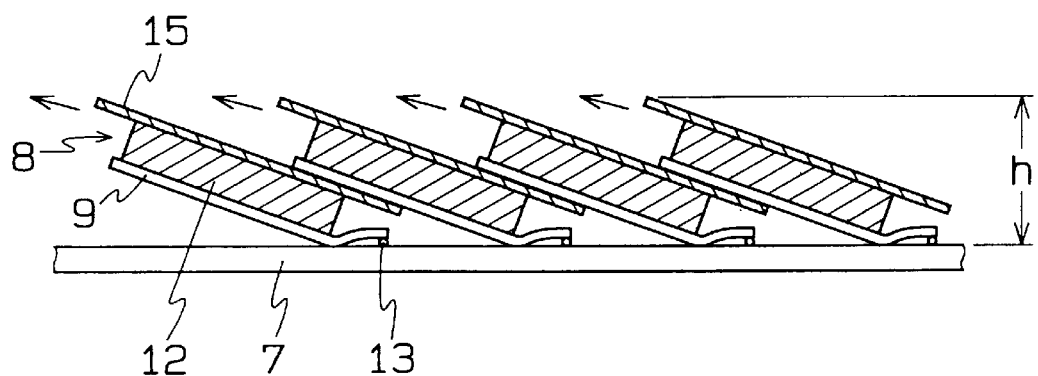
FIG. 7 is another side view showing a semiconductor module according to Embodiment 1 of the present invention.

Furthermore, FIG. 7 shows a radiating means 15 such as radiating plate arranged between the adjacent semiconductor packages 8 of a semiconductor module shown in FIG. 6. In the packaging operation by leaning a plurality of semiconductor packages 8, the excessive rising of temperature due to heat generation from the semiconductor element 3 operated at a high speed can be prevented by interposing the radiating means 15 between the adjacent semiconductor packages 8. The radiating means 15 is extended in an direction (in an arrow direction in the drawing) opposite to that of the soldering ball 13 which is an external connection terminal and can be air-cooled by a fan (not shown) of an electronic device such as a computer on which the semiconductor module is mounted. The radiating means 15 can be connected with a housing of an electronic device for conducting a radiating operation.

As described above, according to a semiconductor package 8 of the present embodiment, the semiconductor package 8 can be packaged in a condition where the package 8 is inclined with respect to the packaging substrate 7 by folding the flexible wiring substrate 9, because the semiconductor element 3 is mounted on the flexible wiring substrate 9. Thus, the packaging height h of the package can be made low, thereby making it possible to considerably reduce the packaging volume.

Embodiment 2

Figure 8:
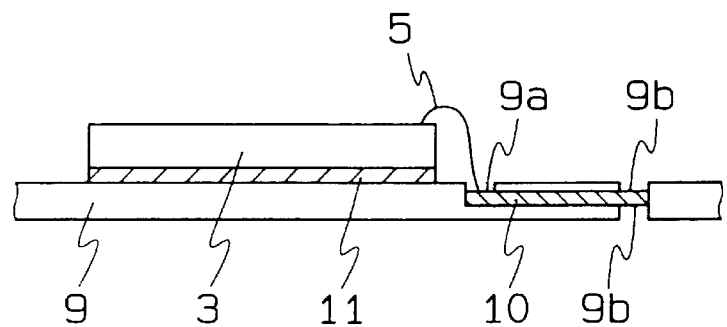
FIG. 8 is a sectional view showing the inside of a semiconductor package according to Embodiment 2 of the present invention.
Figure 9:
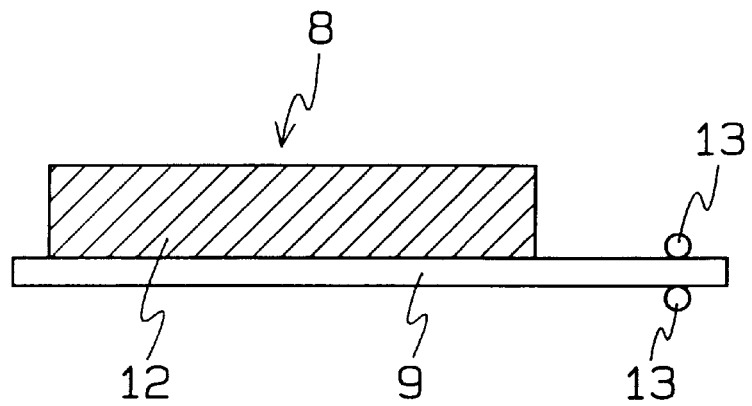
FIG. 9 is a sectional view showing a semiconductor package according to Embodiment 2 of the present invention.

Embodiment 2 of the present invention will be described below with reference to the drawing. FIG. 8 is a sectional view showing the inside of a semiconductor package according to Embodiment 2 of the present invention. FIG. 9 is a sectional view showing a condition after being sealed with a sealing resin. In the drawings, the same numerals are given to the components which are the same as or correspond to those in FIGS. 2 and 4, and hence the description thereof will be omitted. In the aforementioned Embodiment 1, a conductive member, i.e., a soldering ball 13 for external connection is provided only in one surface of a flexible wiring substrate 9. In the present embodiment, however, an opening 9b for external connection is formed at both surfaces of a flexible wiring substrate 9 (refer to FIG. 8), and a soldering ball 13 is mounted on both surfaces (refer to FIG. 9).

Figure 10:
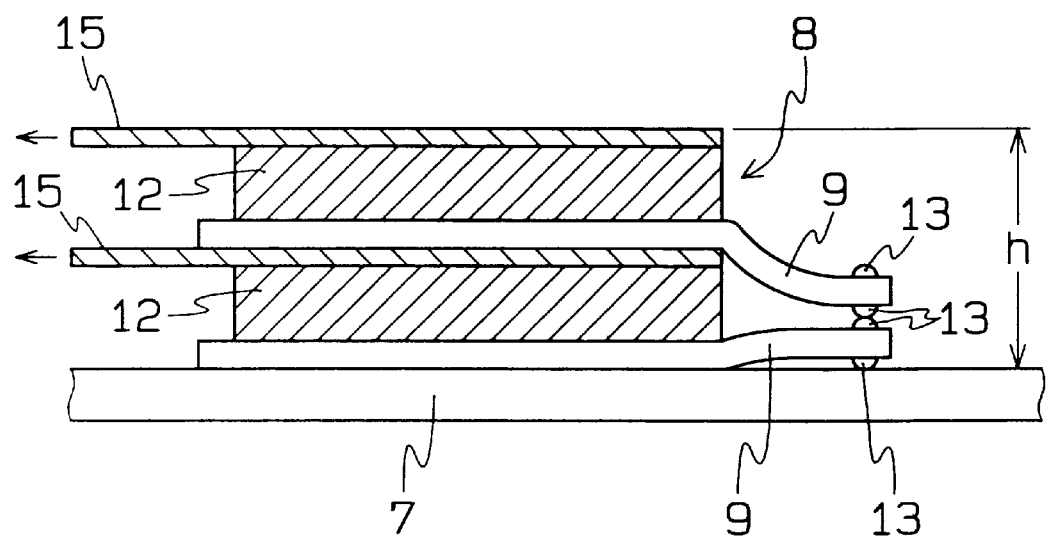
FIG. 10 is a side view showing a semiconductor module according to Embodiment 2 of the present invention.
Figure 11:
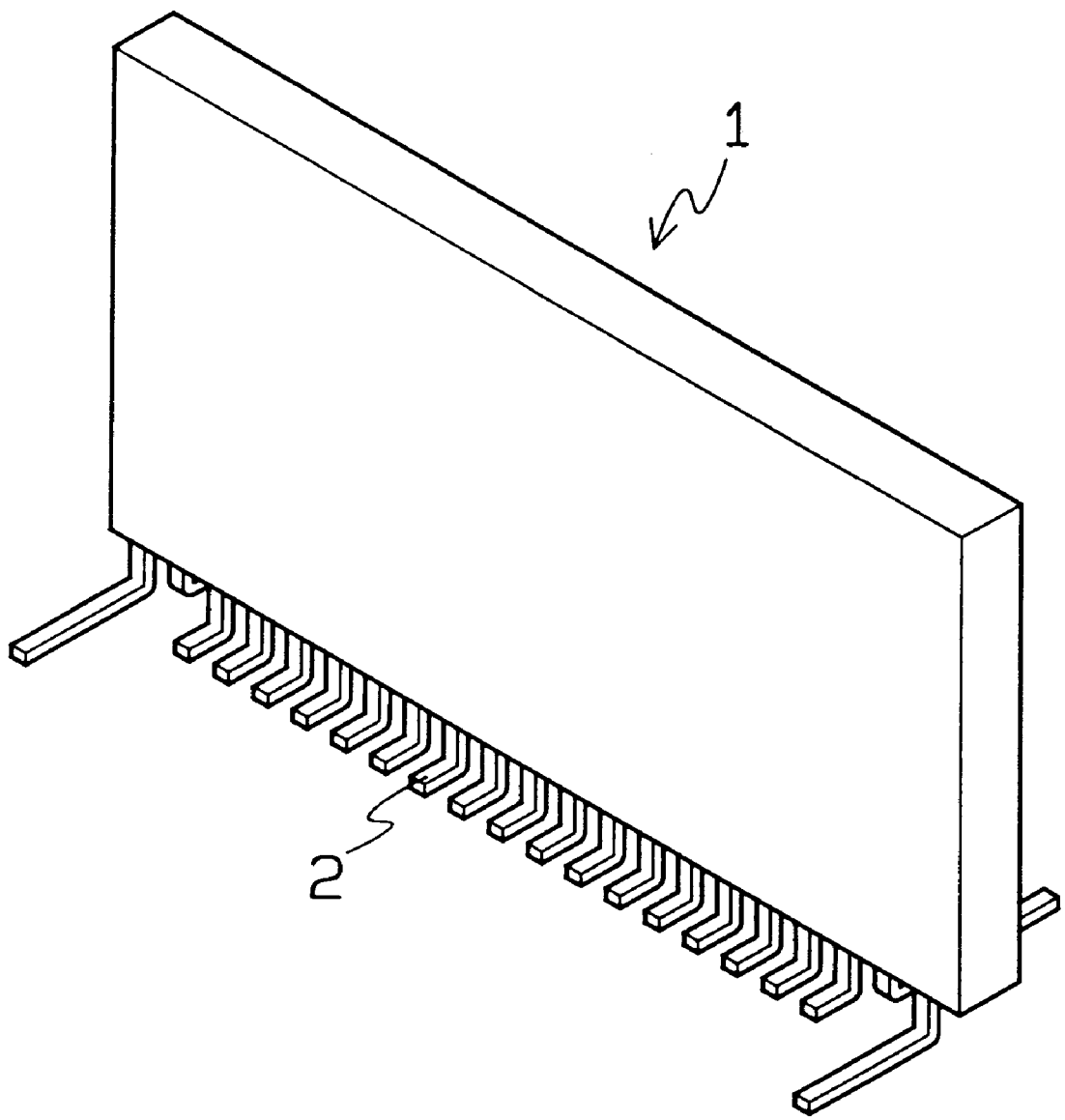
FIG. 11 is a perspective view showing an outer appearance of a conventional semiconductor package.
Figure 12:
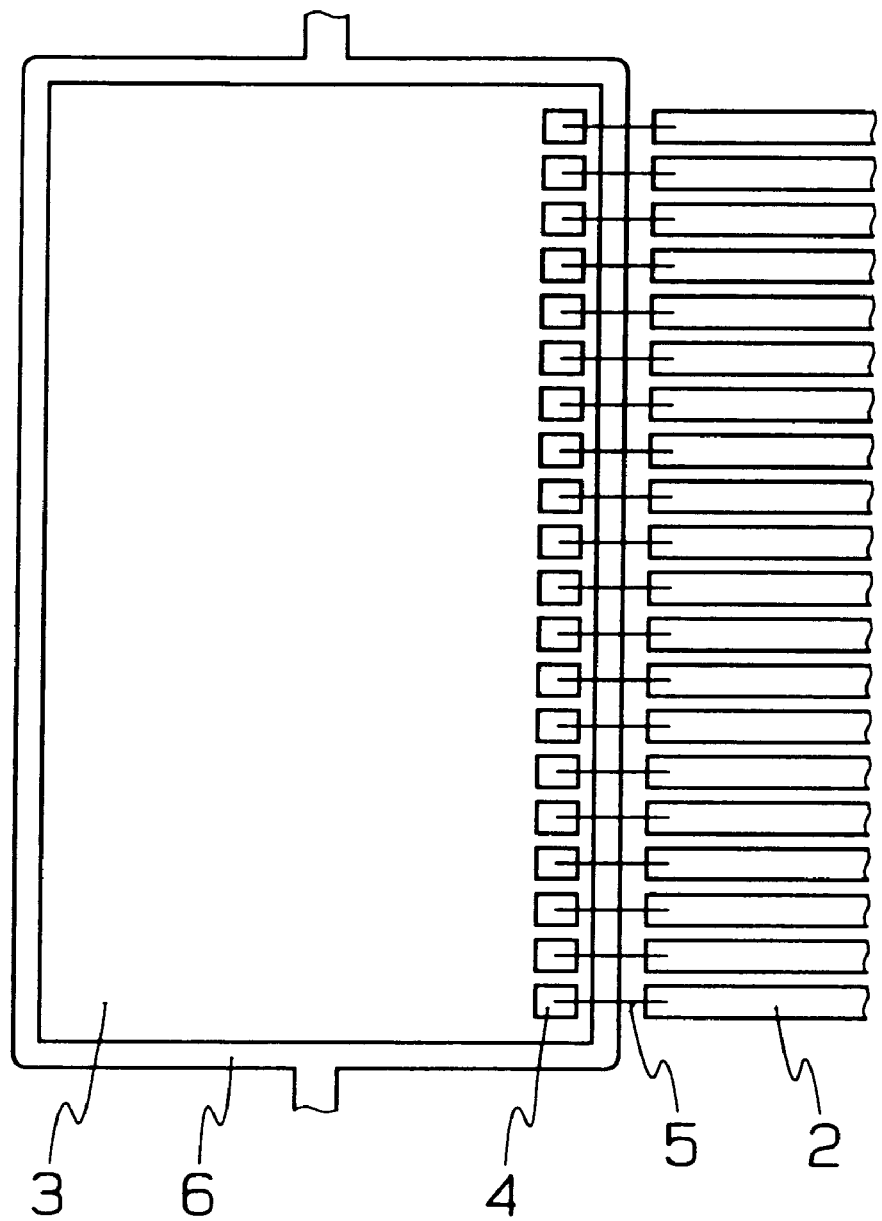
FIG. 12 is a plan view showing the inside of the conventional semiconductor package.
Figure 13:
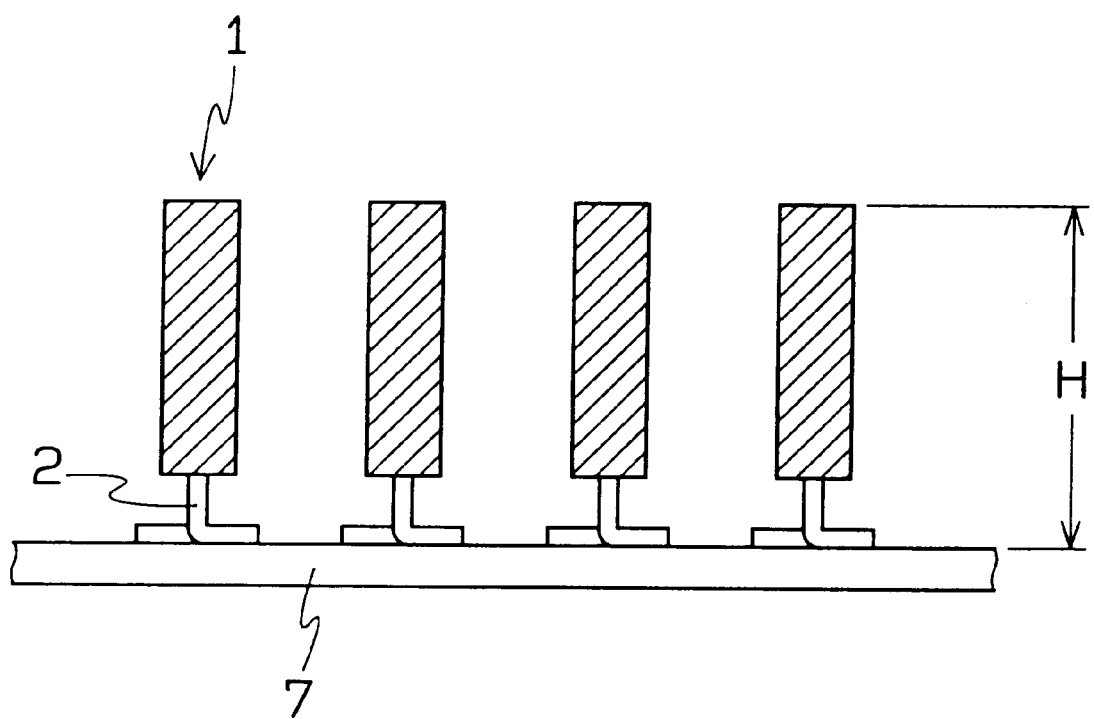
FIG. 13 is a side view showing a case where the conventional semiconductor package is packaged.

A semiconductor module using a semiconductor package according to the present embodiment is shown in FIG. 10. In this module, soldering balls 13 in the same position provided on both surfaces of a flexible wiring substrate 9 in the corresponding same position are connected up and down so as to pile up and package a plurality of semiconductor packages in a horizontal direction to the packaging substrate 7. In the semiconductor module constructed as described above, it is possible to package many packages with keeping the package height h low. The excessive rising of temperature due to heat generation from the semiconductor element 3 operated at a high speed can be prevented by interposing the radiating means 15 between the adjacent semiconductor packages. The radiating means 15 is extended in a direction (in an arrow direction in the drawing) opposite to the soldering ball 13 which is an external connection terminal and can be air-cooled by a fan (not shown) of an electronic device such as a computer on which the semiconductor module is mounted. The radiating means 15 can be connected with a housing of an electronic device for conducting a radiating operation.

Although the electrode 4 of the semiconductor element 3 and the opening 9a for internal connection of the flexible wiring substrate 9 are connected with a wire 5 in Embodiments 1 and 2, they might be connected with a beam lead or bump, other than a wire. As a conductive member for external connection is used the solder ball 13. A different metallic ball or a conductive adhesive, however, can be used.

The electrodes 4, openings 9a for internal connection and openings 9b for external connection are respectively arranged on one straight line, and each length from the electrode 4 to the opening 9b for external connection is maintained approximately constant. When the arrangement of the electrodes 4 is not on a straight line, the positions of the openings 9a for internal connection and the openings 9b for external connection can be shifted respectively in accordance with the arrangement of the electrodes 4 so that each length from the electrode 4 to the opening 9b for external connection can be maintained constant. Although only a single-layerd wiring 10 is shown, a multi-layered wiring might be used. Furthermore, a semiconductor package 8 of the present invention can include a projection or the like for positioning it to a substrate 7 for packaging.

As described above, according to a semiconductor package and a semiconductor module of the present invention, a semiconductor element is mounted on a flexible wiring substrate, and a conductive member for external connection is provided only at one side of a package. The semiconductor package can be connected in a horizontal or inclined condition with respect to the substrate for packaging by folding the flexible wiring substrate. Thus, the packaging height of the package can be made low, thereby making it possible to considerably reduce the packaging volume.

A radiating means is provided between adjacent semiconductor packages of a plurality of semiconductor packages, so that the excessive rising of temperature due to heat generation from a semiconductor element operated at a high speed can be prevented.

What is claimed is:

1. A semiconductor package comprising:
   a rectangular semiconductor element;
   a plurality of electrodes arranged along one side of the rectangular semiconductor element;
   an opening for external connection;
   a plurality of wiring lines, one end of each of the wiring lines electrically connected with a respective electrode of said plurality of electrodes and arranged adjacent thereto and the other end of each of the wiring lines exposed from the opening for external connection;
   a conductive member provided on the opening for external connection;
   a flexible wiring substrate having the semiconductor element mounted thereon, having the conductive member arranged thereon, and having the wiring lines embedded therein; and
   a sealing resin for sealing the semiconductor element and a periphery of the semiconductor element, except for the conductive member,
   wherein the opening for external connection and the conductive member are provided on both surfaces of the flexible wiring substrate.

2. The semiconductor package of claim 1, wherein the conductive member comprises one member selected from the group consisting of solder, metallic ball and adhesive.

3. A semiconductor module comprising a plurality of semiconductor packages, each semiconductor package including:
   a rectangular semiconductor element;
   a plurality of electrodes arranged along one side of the rectangular semiconductor element;
   an opening for external connection;
   a plurality of wiring lines, one end of each of the wiring lines electrically connected with a respective electrode of said plurality of electrodes and arranged adjacent thereto and the other end of each of the wiring lines exposed from the opening for external connection;
   a conductive member provided on the opening for external connection;
   a flexible wiring substrate having the semiconductor element mounted thereon, having the wiring lines and the conductive member arranged thereon and having the opening for external connection provided on a surface thereof; and
   a sealing resin for sealing the semiconductor element and a periphery of the semiconductor element, except for the conductive member,
   wherein the semiconductor packages are brought down and piled up to lean one against another, and are packaged obliquely, and
   the opening for external connection and the conductive member are provided on both surfaces of the flexible wiring substrate.

4. The semiconductor module of claim 3, wherein a radiating means is interposed between adjacent semiconductor packages of the plurality of semiconductor packages.

5. A semiconductor module comprising a plurality of semiconductor packages, each semiconductor package including:
   a rectangular semiconductor element;
   a plurality of electrodes arranged along one side of the rectangular semiconductor element;
   an opening for external connection;
   a plurality of wiring lines, one end of each of the wiring lines electrically connected with a respective electrode of said plurality of electrodes and arranged adjacent thereto and the other end of each of the wiring lines exposed from the opening for external connection;
   a conductive member provided on the opening for external connection;
   a flexible wiring substrate having the semiconductor element mounted thereon, having the wiring lines and the conductive member arranged thereon and having the opening for external connection provided on a surface thereof; and a sealing resin for sealing the semiconductor element and a periphery of the semiconductor element, except for the conductive member, wherein the opening for external connection and the conductive member are provided on both surfaces of the flexible wiring substrate, the semiconductor packages are piled up on a substrate for packaging in a horizontal direction, and the conductive member is provided on both surfaces of the flexible wiring substrate for interconnecting the plurality of semiconductor packages.

6. The semiconductor module of claim 5, wherein a radiating means is interposed between adjacent semiconductor packages of the plurality of semiconductor packages.

* * * * *